(12) United States Patent
Sibuet et al.

(10) Patent No.: US 7,834,723 B2
(45) Date of Patent: Nov. 16, 2010

(54) ACTUATION MICROSYSTEM AND METHOD OF PRODUCING SAME

(75) Inventors: Henry Sibuet, Le Fontanil (FR); Christel Dieppedale, Crolles (FR)

(73) Assignee: Commissariat a l'Energie Atomique, Paris (FR)

(*) Notice: Subject to any disclaimer, the term of this patent is extended or adjusted under 35 U.S.C. 154(b) by 244 days.

(21) Appl. No.: 12/010,628

(22) Filed: Jan. 28, 2008

(65) Prior Publication Data

US 2008/0186117 A1 Aug. 7, 2008

(30) Foreign Application Priority Data

Feb. 5, 2007 (FR) .................................. 07 00801

(51) Int. Cl.
*H01H 51/22* (2006.01)
(52) U.S. Cl. ......................................... 335/78; 200/181
(58) Field of Classification Search ................... 335/78; 200/181
See application file for complete search history.

(56) References Cited

U.S. PATENT DOCUMENTS

| | | | |
|---|---|---|---|
| 2,709,791 A | | 5/1955 | Anderson, Jr. |
| 6,373,007 B1 * | | 4/2002 | Calcatera et al. ............ 200/181 |
| 6,418,081 B1 * | | 7/2002 | Sen et al. ...................... 367/99 |
| 6,570,750 B1 * | | 5/2003 | Calcatera et al. ............ 361/115 |
| 6,734,770 B2 * | | 5/2004 | Aigner et al. ................ 335/78 |
| 6,750,745 B1 | | 6/2004 | Wei et al. |
| 6,828,888 B2 * | | 12/2004 | Iwata et al. ................... 335/78 |
| 2003/0173957 A1 | | 9/2003 | Shen et al. |
| 2003/0179058 A1 | | 9/2003 | Vaitkus et al. |
| 2005/0001701 A1 | | 1/2005 | Shirakawa |
| 2005/0083156 A1 | | 4/2005 | Shen et al. |

OTHER PUBLICATIONS

Hou M. et al., "Effect of Width on the Stress-Induced Bending of Micromachined Bilayer Cantilevers," 2003, J. Micromech. Microeng. vol. 13, pp. 141-148.
Lee S. et al., "Curled Micro-Cantilevers Using Benzocyclobutene Polymer and Mo for Wafer Level Probing," 2005, Sensors and Actuators, vol. 121, pp. 472-479.

* cited by examiner

*Primary Examiner*—Anh T Mai
*Assistant Examiner*—Bernard Rojas
(74) *Attorney, Agent, or Firm*—Oliff & Berridge, PLC

(57) ABSTRACT

The actuation microsystem is produced on a flat substrate and comprises a pivoting arm mounted in rotation around a hinge, a stationary contact pad arranged on the substrate, and an end of opening travel stop of the pivoting arm. The end of travel stop comprises a top part, for example a head, arranged above and at a distance from the pivoting arm between an articulation end and a free end of the pivoting arm. The stop comprises a bottom part arranged laterally with respect to the pivoting arm, between the hinge and the stationary contact pad, and formed for example by a foot comprising a support pad formed on the substrate, a pedestal extending the support pad and a support portion of the head.

17 Claims, 4 Drawing Sheets

ACTUATION MICROSYSTEM AND METHOD OF PRODUCING SAME

BACKGROUND OF THE INVENTION

The invention relates to an actuation microsystem made on a flat substrate and comprising at least:

- a pivoting arm mounted in rotation around a hinge formed on the substrate,
- a first stationary contact pad arranged on a top surface of the substrate and operating in conjunction with at least one movable contact pad securedly affixed to the pivoting arm,
- and an end of opening travel stop of the pivoting arm.

The invention also relates to a method of fabrication of one such microsystem.

STATE OF THE ART

US Patent applications 2003/0173957 and US 2005/0083156 and U.S. Pat. No. 6,750,745 each describe an actuation microsystem, more particularly an electric circuit interrupting device, by means of a mobile magnetic element. Such devices are fabricated by means of processes developed in the microelectronic field giving a good integration capacity, thus aiming to reduce manufacturing costs while preserving a good control of fabrication.

As represented very schematically in FIG. 1, such an actuation microsystem 1, according to the prior art, is achieved on a flat substrate 2 and comprises a pivoting arm 3 mounted in rotation and articulated around a hinge 4 supported by substrate 2. Pivoting arm 3 is actuated for example by a vertical magnetic force F directed upwards perpendicularly to substrate 2, and comprises a movable contact pad 5 securedly affixed to the bottom surface of pivoting arm 3 and designed to come into contact with a stationary contact pad 6 made on the top surface of substrate 2.

The question of blocking rotation of pivoting arm 3 has been brought up, in particular so as to impose an elasticity limit at the level of hinge 4 to prevent excessive deformation of pivoting arm 3 which would lead to quicker aging of microsystem 1. US Patent application 2005/0083156 in particular describes the necessity of using a blocking mechanism, for example an end-of-travel stop, to control opening of pivoting arm 3. As represented in FIG. 1, an end of opening travel stop 7 of pivoting arm 3 is achieved on substrate 2 and placed substantially at the rear of hinge 4. The end of pivoting arm 3 opposite the end comprising movable contact pad 5 then presses on end of opening travel stop 7 to prevent rotation of pivoting arm 3.

However, this type of stop is not satisfactory, for its objective is only to achieve approximate positioning of the pivoting arm and does not efficiently limit the forces applied on the hinge.

The document U.S. Pat. No. 2,709,791 describes achievement of a switch comprising a stop device to limit movement of a movable element.

OBJECT OF THE INVENTION

The object of the invention is to remedy all the above-mentioned shortcomings and to provide an actuation microsystem comprising an end of opening travel stop of a pivoting arm that is efficient, does not impair operation of the microsystem, and which enables rotation of the pivoting arm to be controlled.

According to the invention, this object is achieved by the accompanying claims and, more particularly by the fact that the end-of-travel stop formed on the substrate comprises:

- a top part arranged above and at a distance from the pivoting arm, between an articulation end of the pivoting arm on the hinge and a free end of the pivoting arm comprising the movable contact pad,
- a bottom part connected to the substrate and arranged laterally with respect to the pivoting arm between the hinge and the stationary contact pad.

It is a further object of the invention to provide a method for producing one such microsystem that is simple, quick and economical.

BRIEF DESCRIPTION OF THE DRAWINGS

Other advantages and features will become more clearly apparent from the following description of particular embodiments of the invention given for non-restrictive example purposes only and represented in the accompanying drawings, in which.

DESCRIPTION OF PARTICULAR EMBODIMENTS

Figure 1:
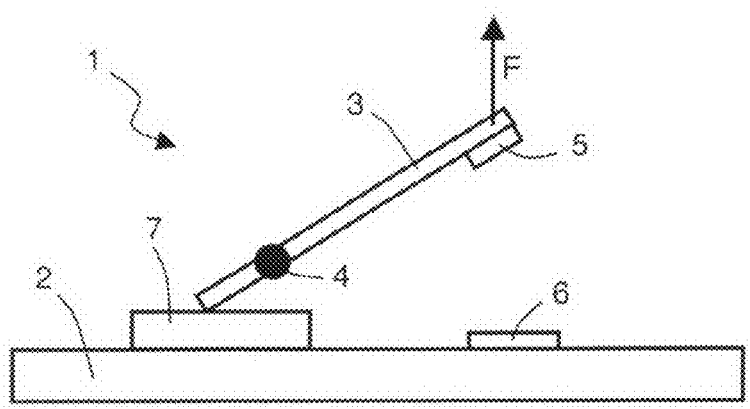
FIG. 1 very schematically represents a front face of an actuation microsystem with an end of opening travel stop of a pivoting arm according to the prior art.

In the first particular embodiment of the invention represented in FIGS. 2 to 8, actuation microsystem 1 according to the invention comprises pivoting arm 3, for example in the form of a plate having two longitudinal edges 3a and 3b, mounted in rotation around hinge 4 at the level of an articulation end 3c. Pivoting arm 3 comprises for example two movable contact pads 5 placed at the level of a free end 3d of pivoting arm 3, opposite articulation end 3c, securedly affixed to the bottom surface of pivoting arm 3 and designed to operate for example in conjunction with two stationary contact pads 6 made on the top surface of substrate 2.

Microsystem 1 comprises for example two end of opening travel stops 7a, 7b of pivoting arm 3 (FIG. 2), formed on the substrate, arranged on each side of pivoting arm 3 and against which the longitudinal edges 3a, 3b of pivoting arm 3 respectively press to block rotation of pivoting arm 3.

Figure 2:
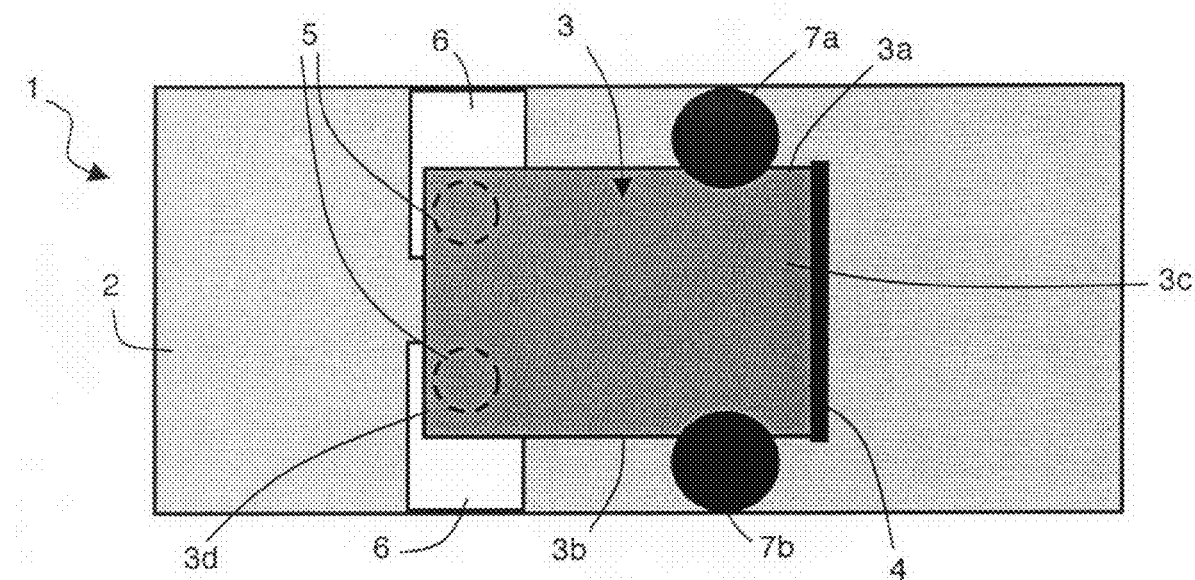
FIGS. 2 and 3 schematically represent respectively a top view and a side view of a first alternative embodiment of an actuation microsystem with an end of opening travel stop of a pivoting arm according to the invention.
Figure 3:
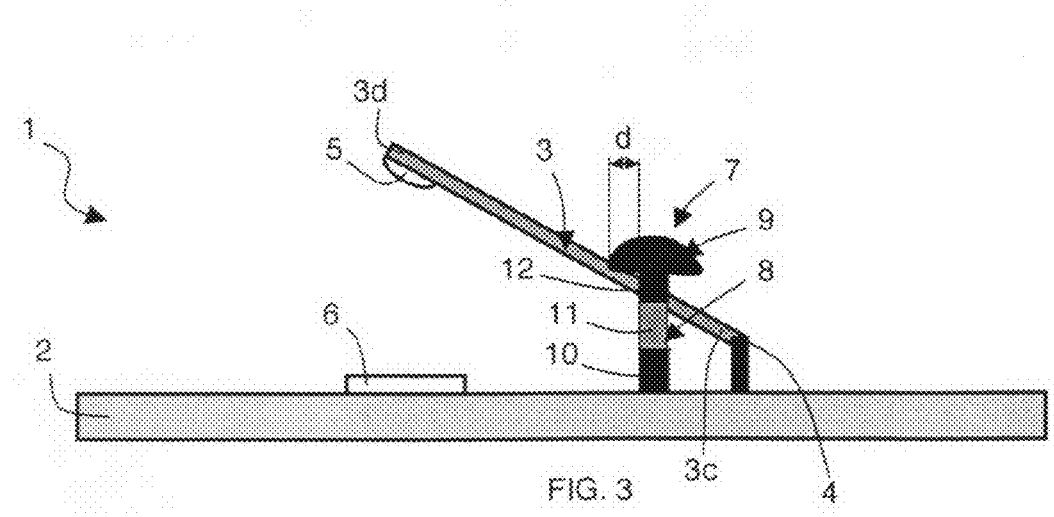

In FIGS. 2 and 3, the following description concerns an end of travel stop course 7 and applies for both end of travel stops 7a, 7b. End of travel stop 7 comprises a foot 8 and a head 9 defining a stop that is substantially in the form of a mushroom at least partially salient above the corresponding longitudinal edge 3a, 3b of pivoting arm 3. Foot 8 of stop 7 is arranged between hinge 4 and stationary contact pad 6 made on substrate 2 (FIG. 2), and foot 8 is formed in three parts.

In FIG. 3, the first part of foot 8 is a support pad 10 formed on substrate 2 and preferably from the same material as hinge 4, in particular any material that does not degrade during release by etching of pivoting arm 3 during the fabrication method as described hereafter. The second part of foot 8 is a pedestal 11 extending support pad 10 and preferably formed from the same material as pivoting arm 3. The third part of foot 8 is a support portion 12 of head 9 preferably formed from the same material as head 9.

Head 9 of end of travel stop 7 is for example convex to substantially define the characteristic shape of a mushroom head and is salient above associated longitudinal edge 3a, 3b of pivoting arm 3 to block rotation of pivoting arm 3 and therefore to act as end of travel stop for opening of pivoting arm 3. The characteristic mushroom-head shape of head 9 of end of travel stop 7 is advantageously obtained by electrolytic deposition of a material compatible with this type of method, in particular any metallic material able to withstand the etching steps enabling the microsystem to be released as described hereafter.

For example, head 9 and support portion 12 of head 9 are made of iron, nickel, gold, chromium or any alloy comprising at least two of these materials. Support portion 12 of head 9 has a thickness of about 1 µm to 5 µm. Pivoting arm 3 is composed of a layer of ferromagnetic material, for example a nickel and iron alloy, and has a thickness of about 5 µm to 10 µm. Support pad 10 and hinge 4 are made of chromium, nickel or gold, or chromium and nickel alloy, nickel and gold alloy or advantageously chromium, nickel and gold alloy.

Moreover, head 9 of stop 7 is for example of convex circular shape and presents a diameter that is larger than the width of support portion 12 by a distance d of about 2 µm. Such dimensions therefore enable a predetermined opening angle to be determined for pivoting arm 3, for rotation thereof around hinge 4, until it comes up against the stop formed by head 9 of end of travel stop 7 (FIG. 3).

Figure 4:
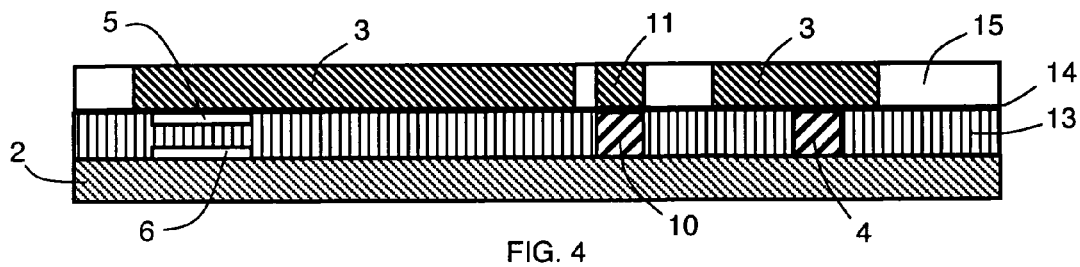
FIGS. 4 to 8 are side views schematically representing different successive steps of a method for producing an actuation microsystem according to FIGS. 2 and 3.

A method for producing microsystem 1 according to the invention, as represented in FIGS. 2 and 3, will be described in greater detail with regard to FIGS. 4 to 8. In FIG. 4, the method comprises, in a first step, formation of the stationary contact pads 6 on the top surface of substrate 2, then in a second step, preferably simultaneous formation of hinge 4 and support pads 10 of feet 8 of end of travel stops 7 (FIG. 3). Support pads 10 are formed between hinge 4 and stationary contact pads 6 by patterning of a first layer made from one and the same material, for example chromium, nickel, gold or chromium and nickel alloy, deposited on substrate 2 and previously formed stationary contact pads 6.

In FIG. 4, a sacrificial layer 13 for example made of silicon oxide ($SiO_2$), formed for example by Plasma Enhanced Chemical Vapor Deposition (PECVD), is then formed in a third step around hinge 4, support pads 10 and stationary contact pads 6. In a fourth step, a conducting layer for example made of gold, nickel, chromium, platinum or ruthenium, with a thickness of about 0.1 µm to 1 µm, is then deposited on sacrificial layer 13 so as to form at least one movable contact pad 5 on the bottom surface of pivoting arm 3, designed to come into contact on associated stationary contact pads 6.

In FIG. 4, in a fifth step, the method then comprises formation of pivoting arm 3 in a second layer, for example made of nickel and iron alloy, from a conducting layer 14, for example made of nickel, gold or nickel and iron alloy with a thickness of about 0.1 µm, deposited on sacrificial layer 13 and patterned in such a way as to enable deposition notably by electrolytic growth. More particularly, the fifth step consists in depositing a photoresist mask 15, for example with a thickness of about 5 µm to 10 µm, on conducting layer 14, mask 15 being partially open according to the predetermined shape of pivoting arm 3 and of pedestal 11, extending support pad 10, to be fabricated. Then pivoting arm 3 and pedestal 11 of foot 8 of end of travel stop 7 are advantageously formed simultaneously, for example by electrolytic deposition of a layer of nickel and iron alloy.

Figure 5:
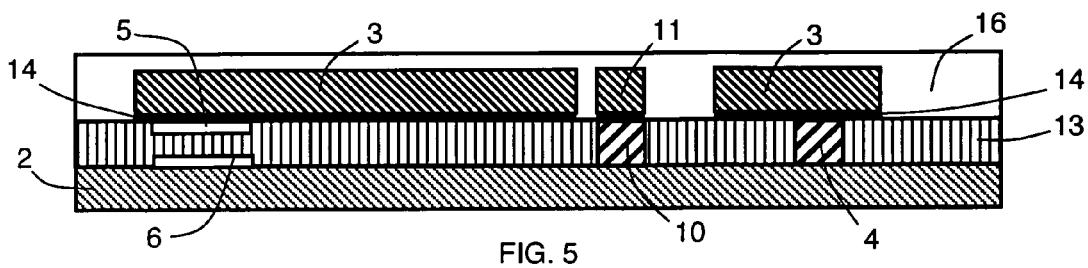
Figure 6:
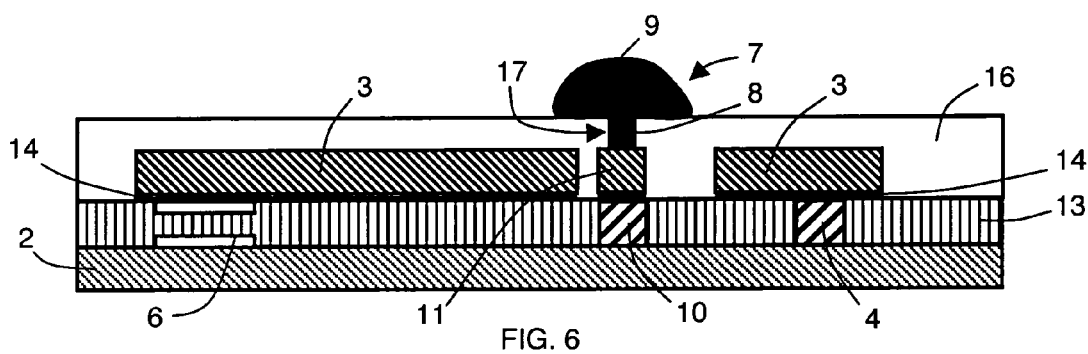

In FIGS. 5 and 6, conducting layer 14 is advantageously etched to the required shape by means of a mask (FIG. 5) to preserve an electric contact for pedestal 11. Then a mask 16, for example made of photoresist, is deposited on pivoting arm 3 and pedestal 11. Mask 16 is then etched so as to form an opening 17 at the level of pedestal 11 (FIG. 6).

A third layer, for example made of nickel and iron alloy, is then deposited for example by electrolytic deposition first up to the top limit of mask 16 to form support portion 12 of head 9 constituting the third part of foot 8 of stop 7, and then by overflow of the material above pivoting arm 3 to form head 9 of end of travel stop 7.

Figure 7:
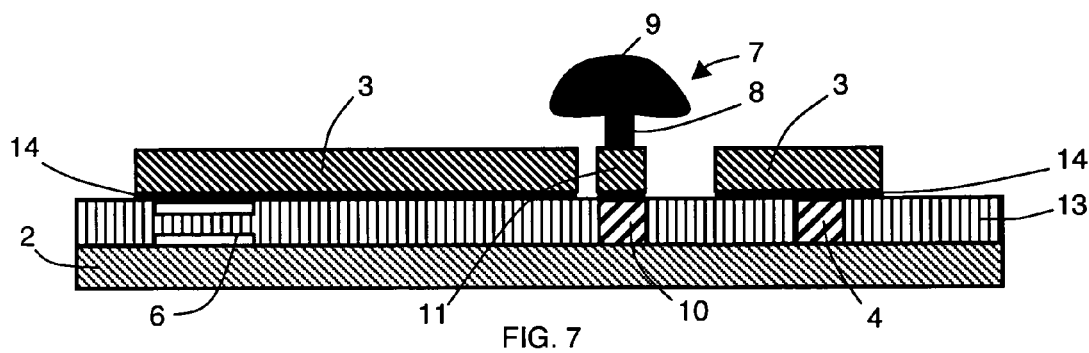
Figure 8:
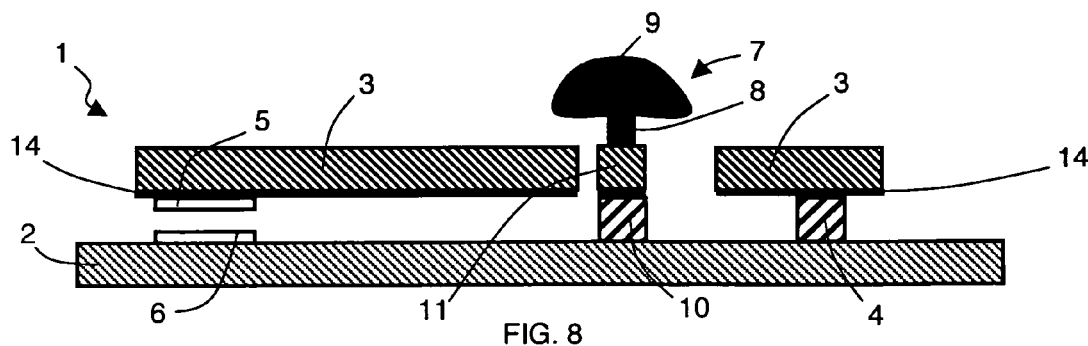

In FIGS. 7 and 8, mask 16 is then removed, for example by etching (FIG. 7), and the remainder of conducting layer 14 is then also removed by etching. Finally, in a sixth step, sacrificial layer 13 is removed, for example by etching with hydrofluoric acid, to release pivoting arm 3. A microsystem 1 as represented schematically in FIGS. 2, 3 and 8 is thus obtained with fabrication of end of travel stops 7 performed in simple manner by manufacturing steps that are conventional in microelectronics, integrated in the fabrication steps of microsystem 1 itself. This results in a gain in terms of time and especially in terms of manufacturing costs.

In the alternative embodiment of the invention represented in FIGS. 9 to 13, actuation microsystem 1 according to the invention differs from microsystem 1 represented in FIGS. 2 to 8 by the shape of end of opening travel stop 7 of pivoting arm 3.

Figure 9:
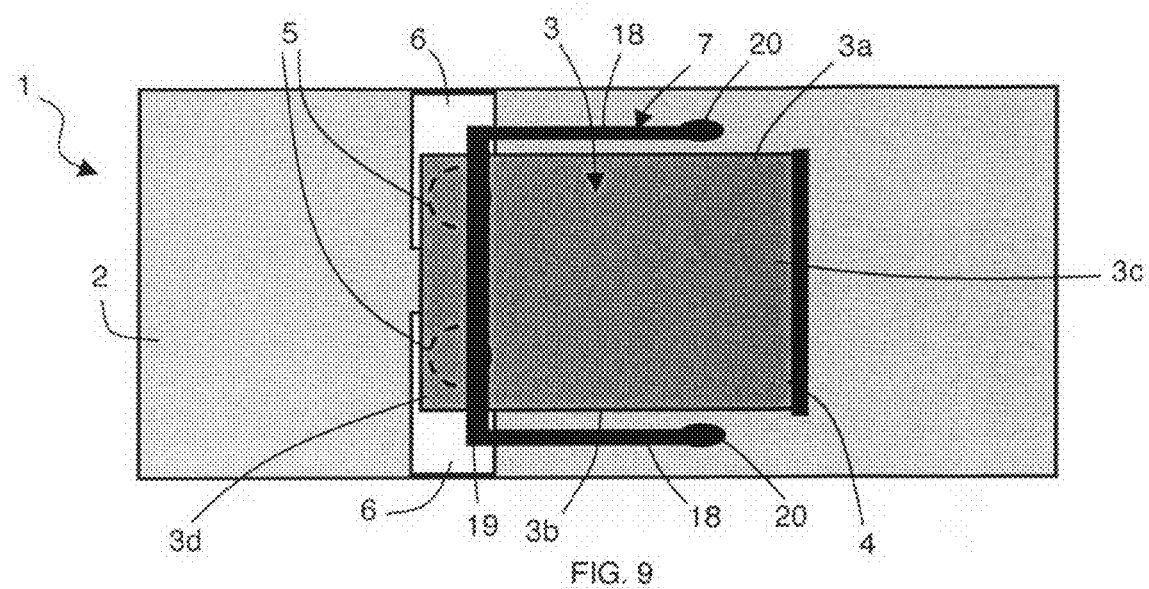
FIGS. 9 and 10 schematically represent, respectively a top view and a front view of a second alternative embodiment of an actuation microsystem with an end of opening travel stop of a pivoting arm according to the invention.
Figure 10:
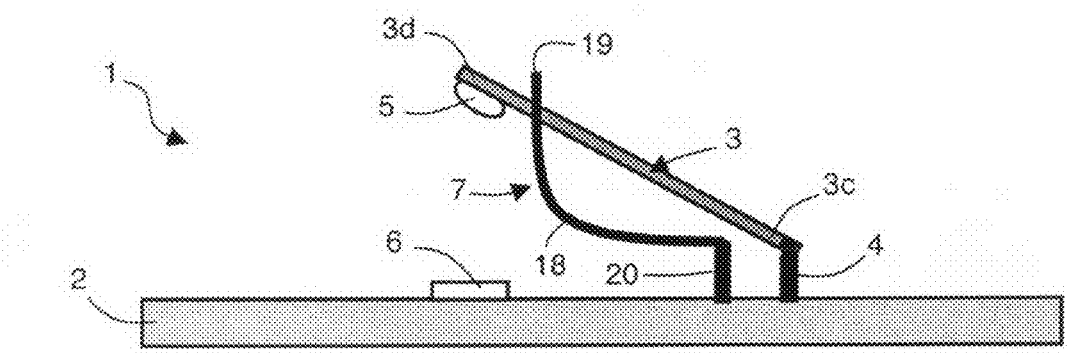

In FIGS. 9 and 10, end of travel stop 7 is U-shaped substantially defining a frame comprising two stressed lateral branches 18 joined by a transverse branch 19 which can be made from a material which can be the same as or different from that of the lateral branches 18. More particularly, transverse branch 19 is made from any insulating, semi-conducting or conducting material that is non-soluble in hydrofluoric acid, for example silicon nitride, silicon, nickel, chromium, gold or any nickel, chromium and gold based alloy.

The term "stressed" means that at least lateral branches 18 of end of travel stop 7 are composed of layers of different materials, i.e. having different thermal expansion coefficients or different stress states. This then results in deformation thereof after the stresses are relaxed enabling them in particular to take a substantially raised position at rest (FIGS. 10 and 13), as described in particular in the article "Effect of width on the stress-induced bending of micromachined bilayer cantilevers" by Max Ti-Kuang Hou et al. (J. Micromech. Microeng. 13 (2003) pp. 141-148) and in the article "Curled micro-cantilevers using benzocyclobutene polymer and Mo for wafer level probing" by Si-Hyung Lee et al. (Sensors and Actuators A 121 (2005) pp. 472-479).

In FIGS. 9 and 10, lateral branches 18 are arranged on each side of pivoting arm 3, parallel to longitudinal edges 3a, 3b, and have a first end connected to substrate 2 by a corresponding support pad 20 and a second end connected to transverse branch 19. Support pads 20 are arranged laterally with respect to pivoting arm 3 (FIG. 9), between hinge 4 and stationary contact pads 6, and lateral branches 18 of end of travel stop 7 are oriented in such a way that transverse branch 19 is situated opposite hinge 4 (FIG. 10).

Lateral branches 18 are bent upwards (FIG. 10) and transverse branch 19 is arranged above and at a distance from pivoting arm 3, between end 3c of pivoting arm 3 articulated on hinge 4, and free end 3d of pivoting arm 3 associated with movable contact pad 5.

The particular raised shape of lateral branches 18 enabling transverse branch 19 to be placed above pivoting arm 3 and to act as stop to block rotation of pivoting arm 3 is in particular due to the stressed materials used for fabricating end of travel stop 7, as described hereafter.

In the particular embodiment represented in FIGS. 9 to 13, at least lateral branches 18 of end of travel stop 7 are therefore composed of a stack of stressed layers, preferably a stack of a metal layer and a polymer layer or a stack of a metal layer and a silicon nitride layer.

For example, the stack constituting end of travel stop 7 is composed of a layer of nickel, for example with a thickness of about 0.1 µm, and a layer of silicon nitride with a thickness of about 0.2 µm. Moreover, as previously, pivoting arm 3 is preferably composed of a layer of ferromagnetic material, for example made of a nickel and iron alloy with a thickness of about 5 µm to 10 µm.

For example, end of travel stop 7 can be composed of a stack of a molybdenum layer and a benzocyclobutene layer (more commonly called BCB), in particular in the case where end of travel stop 7 is composed of a stack of differentially stressed layers, i.e. layers having different thermal expansion coefficients or different stress states. As the deformation mechanisms by stress are very closely linked to the methods of producing the layers and to their mechanical properties, dimensioning of devices obtained by numerical simulations do in fact prove to be none too relevant. The successive iteration approach on the thicknesses and comparisons of sets of shape with progressive variation therefore make it possible to define a shape able to perform blocking at a given height.

A method for fabrication of microsystem 1 according to the invention, as represented in FIGS. 9 and 10, will be described in greater detail with regard to FIGS. 11 to 13. The method comprises the same six steps as for the previous alternative embodiment, but fabrication of end of travel stop 7 is performed between the third step and fourth step, i.e. after the formation step of a sacrificial layer 21 (FIG. 11) and before the formation step of a conducting layer to produce movable contact pads 5 associated with pivoting arm 3 (FIG. 12).

Figure 11:
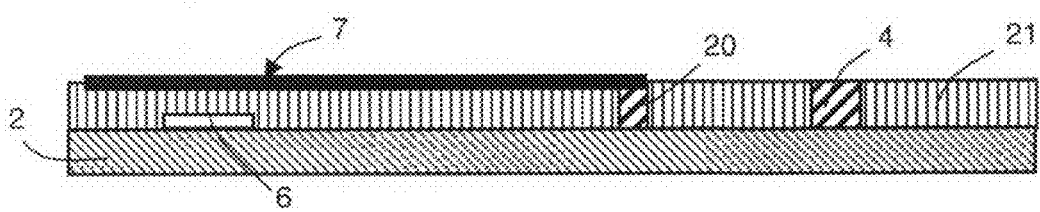
FIGS. 11 to 13 are side views schematically representing different successive steps of a method for producing an actuation microsystem according to FIGS. 9 and 10.

In FIG. 11, the method therefore first of all comprises formation of support pads 20 of lateral branches 18 of end of travel stop 7 and, preferably simultaneously, formation of hinge 4 on which pivoting arm 3 is mounted in rotation. Then a sacrificial layer 21, for example made of silicon oxide, with a thickness of about 1 µm to 5 µm, is deposited for example by PECVD. A stack of stressed layers is then deposited on sacrificial layer 21 and etched to the required form of end of travel stop 7, i.e. in the form of a U-shaped gate frame (FIG. 9).

Figure 12:
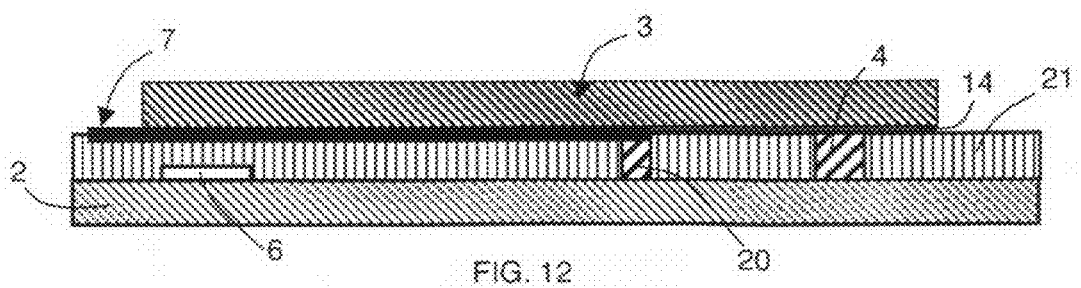

In FIG. 12, conducting layer 14 is then deposited on sacrificial layer 21, corresponding to the fourth step, and pivoting arm 3 is then formed as before on conducting layer 14, for example by electrolytic growth, between lateral branches 18 of end of travel stop 7.

Figure 13:
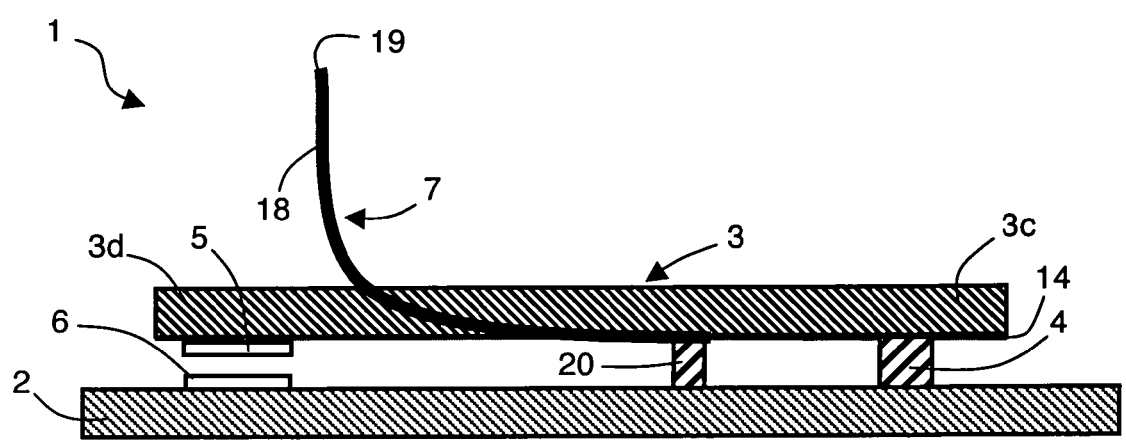

Finally, as represented in FIG. 13, after sacrificial layer 21 has been removed, the stresses in the stack of layers composing end of travel stop 7 then make end of travel stop 7 rise, with transverse branch 19 which therefore mechanically limits the vertical travel of pivoting arm 3 and lateral branches 18 which curve upwards. Transverse branch 19 thus places itself above free end 3d of pivoting arm 3, between free end 3d and end 3c articulated on hinge 4 of pivoting arm 3.

Whatever the embodiment described above, microsystem 1 according to the invention thus comprises an efficient end of travel stop 7, with rotation of pivoting arm 3 limited according to the height and position of the top part of stop 7, which is arranged above and at a distance from pivoting arm 3, between articulation end 3c and free end 3d of pivoting arm 3. The height and position of end of travel stop 7 with respect to pivoting arm 3 thus determine the opening angle, i.e. the possible rotation amplitude, of pivoting arm 3, and blocking of pivoting arm 3 is obtained by pressing on a portion of stop 7 that places itself overhanging pivoting arm 3.

Moreover, the main advantage of such a microsystem 1, whether it be the embodiment represented in FIGS. 2 and 3 (first alternative embodiment) or 9 and 10 (second alternative embodiment), resides in the fact that fabrication of end of travel stop 7 is integrated in the fabrication steps of microsystem 1 itself, whatever the shape of end of travel stop 7. The method according to the invention thus proposes to fabricate end of travel stop 7 on substrate 2 supporting pivoting arm 3 in the course of fabrication of the latter and using microelectronics steps. In this way, by means of the layers used for fabrication of microsystem 1 and the addition of new fabrication steps, it is possible to achieve a blocking structure integrated in the microsystem support, while at the same time controlling the possible opening angle of the pivoting arm and keeping the benefits of integration.

Moreover, such a microsystem 1 according to the invention (FIGS. 2 to 13) also presents the following advantages. Microsystem 1 does not require any specific mechanical positioning of pivoting arm 3 with respect to end of travel stop 7. Microsystem 1 is achieved according to techniques that are conventional in microelectronics, which results in a precision to within a micron of the dimensions of microsystem 1 obtained and a great reproducibility of the fabrication method.

Such a fabrication method according to the invention (FIGS. 2 to 13) is therefore easy to implement and does not give rise to any additional cost, in particular due to the use of techniques that are conventional in microelectronics and to fabrication of the end of travel stop being integrated during fabrication of the microsystem. Moreover, it is possible to change the amplitude of rotation of pivoting arm 3 on substrate 2 easily by only changing the shape and dimensions of the masks used for fabrication of pivoting arm 3 and end of travel stop 7, more particularly for fabrication of the support portion of head 12 of foot 8 in the first alternative embodiment (FIGS. 2 to 8), and for fabrication of the stressed stack of layers composing stop 7 in the second alternative embodiment (FIGS. 9 to 13).

Such an actuation microsystem and such a fabrication method according to the invention apply in particular each time the travel of a movable element on a device has to be limited by means integrated in this device, more particularly each time the movable part of a switch can deform thereby being detrimental to the mechanical properties of the latter. This type of switch can be found in particular in products of domestic, automobile, telecommunication type, etc., where miniaturization gives advantages of reliability and cost reduction.

The invention is not limited to the different embodiments described above. In a general manner, microsystem 1 can comprise any type of end of travel stop 7 securedly affixed to substrate, whatever its shape and dimensions, so long as end of travel stop 7 comprises a top portion arranged above and at a distance from pivoting arm 3, designed to block rotation of pivoting arm 3, and a bottom part connected to the substrate and arranged laterally with respect to pivoting arm 3. Microsystem 1 can be achieved by any type of manufacturing process, preferably so long as fabrication of end of travel stop 7 is integrated in fabrication of microsystem 1 itself.

The invention claimed is:

1. An actuation microsystem made on a flat substrate and comprising at least:
    a pivoting arm mounted in rotation around a hinge formed on the substrate,
    a first stationary contact pad arranged on a top surface of the substrate and operating in conjunction with at least one movable contact pad securely affixed to the pivoting arm, and an end of opening travel stop of the pivoting arm, wherein
    the end of travel stop formed on the substrate comprises:
    a top part arranged above and at a distance from the pivoting arm, between an articulation end of the pivoting arm on the hinge and a free end of the pivoting arm comprising the movable contact pad,
    a bottom part connected to the substrate and arranged laterally with respect to the pivoting arm between the hinge and the stationary contact pad, and
    the end of travel stop is U-shaped, when viewed in plan view, and comprises two stressed lateral branches forming the bottom part of the end of travel stop, arranged on each side of the pivoting arm, bent upward and connected by a transverse branch forming the upper part of the end of travel stop.

2. The microsystem according to claim 1, wherein the pivoting arm comprises a layer of ferromagnetic material.

3. The microsystem according to claim 2, wherein the pivoting arm comprises a layer of nickel and iron alloy.

4. The microsystem according to claim 1, wherein the pivoting arm has a thickness of about 5 μm to 10 μm.

5. The microsystem according to claim 1, wherein the lateral branches of the end of travel stop are composed of a stack of stressed layers.

6. The microsystem according to claim 5, wherein the lateral branches of the end of travel stop are composed of a stack of a metal layer and a polymer layer.

7. The microsystem according to claim 5, wherein the lateral branches of the end of travel stop are composed of a stack of a metal layer and a silicon nitride layer.

8. The microsystem according to claim 7, wherein the lateral branches of the end of travel stop are composed of a nickel layer with a thickness of about 0.1 μm, and a silicon nitride layer with a thickness of about 0.2 μm.

9. The microsystem according to claim 5, wherein the lateral branches of the end of travel stop are composed of a stack of a molybdenum layer and a benzocyclobutene layer.

10. The microsystem according to claim 1, wherein the transverse branch is composed of a stack of stressed layers.

11. A method for producing a microsystem comprising:
    forming a first contact pad on a substrate,
    forming, in a first layer, a hinge and a support pad of an end of travel stop wherein the support pad is disposed between the hinge and the first contact pad
    forming a sacrificial layer between the hinge, the support pad and the first contact pad,
    forming a second contact pad facing the first contact pad,
    forming a conductive layer on the sacrificial layer,
    performing electrolytic growth of a second layer and patterning the second layer to form an arm and an extension of said support pad whereby the second contact is affixed to the arm,
    forming, in a third layer, a head of the end of travel stop which partially extends over the arm, and
    removing the sacrificial layer.

12. The method according to claim 11, further comprising performing the electrolytic growth of the second layer made of ferromagnetic material.

13. The method according to claim 12, further comprising performing the electrolytic growth of the second layer made of nickel and iron alloy.

14. The method according to claim 11, further comprising forming a head at least partially salient above a longitudinal edge of the arm wherein the second layer material is located between the head and the support pad.

15. The method according to claim 11, further comprising forming a head at least partially salient above a longitudinal edge of the arm, the head being formed through electrolytic growth.

16. The method according to claim 14, further comprising forming an additional head over an additional support part, wherein the head and the additional head are arranged on each side of longitudinal edges of the arm and are separated by the arm.

17. A method for producing a microsystem comprising:
    forming a first contact pad on a substrate,
    forming, in a first layer, a hinge and a support pad of an end of travel stop wherein the support pad is disposed between the hinge and the first contact pad,
    forming a sacrificial layer between the hinge, the support pad and the first contact pad,
    depositing and patterning a stack of stressed layers to form a U-shaped end of travel stop comprising two lateral branches connected by a transverse branch and each having an end securely affixed to a support pad,
    forming a second contact pad facing the first contact pad,
    forming a conductive layer on the sacrificial layer,
    performing electrolytic growth of a second layer and patterning the second layer to form the arm and an extension of said support pad whereby the second contact is affixed to the arm, the two lateral branches being disposed on each side of the arm,
    removing the sacrificial layer whereby the transverse branch rises above a free end of the arm.

* * * * *